(12) United States Patent
Hedlund et al.

(10) Patent No.: US 11,831,133 B2
(45) Date of Patent: Nov. 28, 2023

(54) BUSHING EQUIPPED WITH AN OPTICAL FIBRE

(71) Applicant: HITACHI ENERGY LTD, Zurich (CH)

(72) Inventors: Roger Hedlund, Ludvika (SE); Peter Sjöberg, Ludvika (SE)

(73) Assignee: HITACHI ENERGY LTD, Zurich (CH)

( * ) Notice: Subject to any disclaimer, the term of this patent is extended or adjusted under 35 U.S.C. 154(b) by 538 days.

(21) Appl. No.: 17/050,446

(22) PCT Filed: Apr. 25, 2019

(86) PCT No.: PCT/EP2019/060669
§ 371 (c)(1),
(2) Date: Oct. 25, 2020

(87) PCT Pub. No.: WO2019/207069
PCT Pub. Date: Oct. 31, 2019

(65) Prior Publication Data
US 2021/0143627 A1 May 13, 2021

(30) Foreign Application Priority Data
Apr. 26, 2018 (EP) .................................. 18169562

(51) Int. Cl.
*H02G 15/072* (2006.01)
*G01K 11/32* (2021.01)
(Continued)

(52) U.S. Cl.
CPC ........... *H02G 15/072* (2013.01); *G01K 11/32* (2013.01); *G01R 29/0885* (2013.01); *H01B 17/28* (2013.01); *H01B 17/583* (2013.01)

(58) Field of Classification Search
CPC .. H02G 15/072; G01K 11/32; G01R 29/0885; H01B 17/28
(Continued)

(56) References Cited

U.S. PATENT DOCUMENTS 4,675,773 A * 6/1987 Shirakawa ............... H02H 7/22
361/107
4,810,836 A * 3/1989 Shinoda .................. G02B 6/442
174/150

(Continued)

FOREIGN PATENT DOCUMENTS

| CN | 101515705 A | 8/2009 |
|---|---|---|
| CN | 101599326 A | 12/2009 |

(Continued)

OTHER PUBLICATIONS

International Search Report and Written Opinion of the International Searching Authority, PCT/EP2019/060669, dated Jun 14, 2019, 22 pages.

(Continued)

*Primary Examiner* — Timothy J Thompson
*Assistant Examiner* — Michael F McAllister
(74) *Attorney, Agent, or Firm* — SAGE PATENT GROUP

(57) ABSTRACT

The invention is concerned with a bushing for high voltage applications and a bushing arrangement including such a bushing. The bushing includes a conductor defining a longitudinal axis (A) through the bushing where the bushing has a central section and a first and a second peripheral section on opposite sides of the central section along the longitudinal axis (A) and includes an optical fibre with a first part (P1) stretching through the central section, the fibre being adapted to detect physical properties being influenced or caused by the operation of the bushing. The sections are sections of a solid condenser core and the bushing further (Continued)

includes an enclosure for a length of fibre that is to exit the bushing, the enclosure being buried in the central section adjacent the surface of the condenser core and having an interior volume.

14 Claims, 6 Drawing Sheets

(51) Int. Cl.
  *H01B 17/28* (2006.01)
  *G01R 29/08* (2006.01)
  *H01B 17/58* (2006.01)
(58) Field of Classification Search
  USPC .......................................................... 174/650
  See application file for complete search history.

(56) References Cited

U.S. PATENT DOCUMENTS

| | | | | |
|---|---|---|---|---|
| 4,845,318 A | * | 7/1989 | Clabburn ............... | G02B 6/442 174/209 |
| 4,919,217 A | * | 4/1990 | Mima .................... | G01R 15/22 29/887 |
| 5,127,083 A | * | 6/1992 | Ikeda .................... | G02B 6/442 174/139 |
| 5,138,692 A | * | 8/1992 | Ikeda .................... | G02B 6/442 174/139 |
| 6,635,828 B2 | * | 10/2003 | Lepley ................. | H01B 17/325 385/12 |
| 2002/0175001 A1 | * | 11/2002 | Lepley ................. | H01B 17/325 174/139 |
| 2011/0122654 A1 | * | 5/2011 | Haefner ................ | H01B 17/26 363/13 |
| 2013/0093410 A1 | * | 4/2013 | Eriksson .............. | G01R 15/242 324/96 |
| 2018/0100878 A1 | * | 4/2018 | Pearce ................. | G01R 15/181 |

FOREIGN PATENT DOCUMENTS

| | | |
|---|---|---|
| CN | 101707343 A | 5/2010 |
| CN | 101836269 A | 9/2010 |
| CN | 201773650 U | 3/2011 |
| CN | 102113189 A | 6/2011 |
| CN | 102522161 A | 6/2012 |
| CN | 102714077 A | 10/2012 |
| FR | 2851686 A1 | 8/2004 |
| JP | H02-163917 A | 6/1990 |
| JP | H04-296409 A | 10/1992 |
| WO | WO 2001/059467 A1 | 8/2001 |
| WO | WO 2017/152985 A1 | 9/2017 |

OTHER PUBLICATIONS

Written Opinion of the International Preliminary Authority, PCT/EP2019/060669, dated Mar. 10, 2020, 9 pages.
International Preliminary Report on Patentabiity of the International Preliminary Examining Authority, PCT/EP2019/060669, dated Jun. 5, 2020, 17 pages.
National Intellectual Property Administration of the People's Republic of China Search Report, CN201980036929.0, dated Aug. 10, 2022, 4 pages.

* cited by examiner

BUSHING EQUIPPED WITH AN OPTICAL FIBRE

CROSS REFERENCE TO RELATED APPLICATIONS

This application is a 35 U.S.C. § 371 national stage application of PCT International Application No. PCT/EP2019/060669 filed on Apr. 25, 2019, which in turns claims foreign priority to European Patent Application No. 18169562.8, filed on Apr. 26, 2018, the disclosures and content of which are incorporated by reference herein in their entirety.

FIELD OF INVENTION

The present invention generally relates to high voltage equipment. More particularly the present invention relates to a bushing for high voltage applications as well as to a bushing arrangement comprising such a bushing.

BACKGROUND

The health and status of bushings for instance a condenser core of a bushing is important in many power systems such as for detecting ageing and degrading of insulation material used in the bushing.

Such health and status is typically determined through offline or online measurements of the change in capacitance and change in tan d. Ageing or degrading of solid insulation is traditionally determined by measuring capacitance or losses (tan d) with online or offline measuring equipment. In this case either a capacitance deviation occurring after break down between the foil insert is detected or an increase in losses (moisture content) using tan d is detected. Increased losses will increase the heat and continue to escalate until there is a thermal runaway.

As the health and status of a bushing is important, it is therefore of interest to improve the determination. Two properties that may be of interest in such improvement are the temperature variations of the insulation and the electrical field stresses experienced by foils of the condenser core.

Temperature measurements have been known to be made in bushings, especially with regard to the central conductor that the condenser core surrounds.

WO 2017/152985 describes one bushing where such a central conductor temperature is measured. According to the document an optical waveguide is placed on and along a conductor of such a bushing for measuring the conductor temperature. The waveguide can also be placed in a solid insulating member in one surrounding insulating layer or in a surrounding metal foil, for instance at a distance of less than 2 centimeters from the central conductor. The optical waveguide may also be placed in additional insulation that is gaseous, porous or foam-like surrounding the solid body.

WO 01/59467 is concerned with a sensor in a bushing. The sensor comprises a sensor coil that may be an optical fibre. This optical fibre may be placed in a middle region of an isolating body and more particularly in solid insulation filling. The document also discloses the use of foils.

JPH04 296409 discloses a bushing where an optical fibre is used for measuring the temperature of an oil filled central conductor. The fibre is placed along the conductor via oil flow openings and placed around a condenser core for leaving the bushing via a grounding flange.

US 2011/0122654 discloses a bushing comprising an optical sensing fibre for sensing the current in a central conductor.

US 2002/0175001 discloses a composite electrical insulator with an integrated optical fibre sensor placed on a support rod inside the insulator.

JP H02 163917 discloses an optical fiber cable in the interior of an insulating tube. The fiber has a spiral shape.

It would in view of what is disclosed above be of interest to obtain a bushing that is better adapted to measuring physical properties of the bushing in order to improve on the health determination of the bushing, which physical properties are properties being influenced or caused by the operation of the bushing. Examples of these physical properties are temperature and experienced electrical field strengths.

Furthermore, it is complicated to produce a bushing where a solid core is combined with a fibre, which may lead to the fibre being harmed when it is to be connected to a detector.

SUMMARY OF THE INVENTION

One object of the present invention is to provide a bushing that addresses the problem of improving the health determination of the bushing combined with allowing a safe extraction of the fibre from the bushing for connection to a detector.

This object is according to a first aspect obtained through a bushing for high voltage applications comprising a conductor defining a longitudinal axis through the bushing, the bushing having a central section and a first and a second peripheral section on opposite sides of the central section along the longitudinal axis, and comprising an optical fibre detecting physical properties influenced or caused by the operation of the bushing and having a first part stretching through the central section, wherein the sections are sections of solid condenser core and there is an enclosure for a length of fibre that is to exit the bushing, which enclosure is buried in the central section adjacent the condenser core surface. The enclosure comprises an interior volume having an inner surface comprising at least one point at a maximum radial distance from the longitudinal axis. The enclosure also comprises a distancing element keeping the length of fibre at a pre-determined distance from the above-mentioned point.

The bushing thus comprises a solid condenser core that surrounds the conductor where the optical fibre is placed inside the condenser core.

In this way the first part of the optical fibre may be placed inside the bushing.

It is furthermore possible that the physical properties are properties indicative of the health of the bushing. The physical properties may furthermore comprise temperature and/or electrical field strength.

The object is according to a second aspect achieved through a bushing arrangement comprising the bushing according to the first aspect and at least one detector configured to detect physical properties of the bushing influenced or caused by the operation of the bushing.

The physical properties being detected may be physical properties of the condenser core that are influenced or caused by the operation of the bushing, which physical properties are properties indicative of the condenser core health. The physical properties may furthermore comprise condenser core temperature and/or electrical field strength.

In a variation of the first and second aspects, the first peripheral and central sections are adapted to be inserted into a piece of high-voltage equipment for being surrounded by insulating fluid and the second peripheral section is adapted to project out from the piece of equipment for being surrounded by air.

In another variation of the first and second aspects, the fibre exits the bushing via a flange surrounding the central section, which flange may be grounded.

According to a further variation of the first and second aspects the interior volume of the enclosure may comprise a first chamber for the length of fibre as well as a second auxiliary chamber, where the second chamber is radially further away from the longitudinal axis than the first chamber. In this case the distancing element may be a wall separating the first chamber from the second chamber and the inner surface may be an inner surface of the second chamber.

The first chamber may have a fibre entry area having a tight seal around the fibre and a fluid exhaust area that is sealed with a unidirectional valve.

The enclosure may be formed as a hose or as a box.

In the case of a box, it is also possible to omit the use of chambers. Instead the distancing element may alternatively be a disc or plate, placed between the inner surface of the interior volume and the length of fibre.

In another variation of the first and second aspects where the bushing comprises a solid condenser core, the second peripheral section comprises a first end joined to the central section and a second end defining an end of the bushing through which the central conductor exits and the fibre comprises a second part with at least one first straight segment stretching outside of the condenser core along the condenser core surface between the first and second ends of the second peripheral section.

It is possible that the second peripheral section is surrounded by a solid isolator, in which case the second part of the fibre stretches in a gap between the condenser core and the solid isolator, where the gap may be filled with fluid insulation The first straight segment may stretch all the way between the first and second ends of the second peripheral section. Alternatively, it may start at the first end of the second peripheral section, stretch a length along the condenser core surface and be joined with a second straight segment that returns back to the first end of the second peripheral section.

In another variation of the first and second aspects, the condenser core comprises a number of foils of conductive material, wound around and coaxial with the conductor, where the length in the longitudinal direction of any foil on a radial distance from the conductor is shorter than the foil length of any neighboring foil on a lower radial distance from the conductor.

The cross-sectional area of the central section may be even. It is additionally possible that the cross-sectional areas of the first and second peripheral sections decrease along the longitudinal axis away from the central section for adapting the size of the section to the varying lengths of the foils.

In a further variation of the first and second aspects, the first part of the fibre comprises a number of turns of fibre wound around the central conductor between different foils of the central section.

When the turns are being wound around different foils of the central section inside a condenser core, it is also possible that the radial distance of the turns increase from a first end of the first part in a first area where the central section joins the first peripheral section towards a second end of the first part in a second area where the central section joins the second peripheral section. It is here also possible that the first part is wound so that it has a funnel shape. It is moreover possible that the first part stretches from being placed between an innermost foil and the conductor to being placed between an outermost foil and the condenser core surface.

In yet another variation of the first and second aspects, each turn encircles an area that is angled in relation to the longitudinal axis of the conductor so that one point of a turn is closest to the second peripheral section and an opposite point of the same turn is closest to the first peripheral section.

In another variation the first part of the fibre comprises turns having the same radius and being placed between the innermost foil and the conductor.

In yet another variation the fibre comprises a third part in the first peripheral section joined with the first part, where the third part has turns with the same radius and is placed between the innermost foil and the conductor.

In still another variation the fibre comprises a fourth part in the second peripheral section joined with the first part, where the fourth part has turns with the same radius and is placed between the innermost foil and the conductor.

The present invention has a number of advantages. It allows the health of the bushing such as the health of the condenser core to be determined in a good way before failure. This health determination can also be used in diagnosing defects in the environment of the bushing. The fibre is typically initially embedded in the condenser core and in order to extract the fibre from the condenser core it is necessary to remove condenser core material. Another advantage of the invention is that this material removal can be made in without harming the fibre.

BRIEF DESCRIPTION OF THE DRAWINGS

The present invention will in the following be described with reference being made to the accompanying drawings, where FIG. 1 schematically shows a detector being connected to a bushing, which in turn is attached to a transformer, FIG. 2 schematically shows a condenser core with a central as well as a first and second peripheral section, all surrounding a central conductor, FIG. 3 schematically shows the bushing comprising the condenser core, a flange, outer isolation on the second peripheral section as well as an optical fibre placed in a first way in the bushing, FIG. 4 schematically shows the bushing with the condenser core, flange, outer isolation and optical fibre placed in a second way in the bushing, and FIG. 5 schematically shows the bushing with the condenser core, flange, outer isolation and optical fibre placed in a third way in the bushing, FIG. 6 schematically shows the central section of the condenser core where a first type of protective enclosure surrounds the last part of the fibre before it enters the flange, FIG. 7 schematically shows a cross-section through the first type of protective enclosure together with different levels of condenser core material before and after a final material removal step, FIG. 8 schematically shows a cut through the first type of enclosure along parts of its length, FIG. 9 schematically shows a second type of protective enclosure, and FIG. 10 schematically shows a cross-section through the second type of enclosure together with different levels of condenser core material before and after a final material removal step.

DETAILED DESCRIPTION OF THE INVENTION

The present invention concerns a bushing for use in high voltage applications, such as high voltage power transmission systems as well as a bushing arrangement comprising a bushing and a detector. A bushing may as an example be provided for use in high voltage equipment, such as reactive high voltage equipment, like transformers.

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

A bushing is a type of apparatus that may be used for measuring electrical properties such as voltages of pieces electrical high-voltage equipment, for instance reactive high-voltage equipment. Examples of equipment include conductors, power lines, cable terminations, inductively operating elements such as reactors and transformers, for instance instrument transformers, and capacitive elements such as capacitors and capacitive voltage dividers. A bushing may also be provided for a dead tank breaker. A high voltage may in this regard be a voltage of around or above 100 kV.

In order to provide correct measurement results, which are vital for the control and safety in high-voltage applications, there is a need for the bushing to function properly. The functioning of it does therefore often have to be diagnosed, i.e. the health of the bushing has to be determined. The present invention is directed towards providing such diagnosis. This type of diagnosis may be provided for determining the health of the bushing, such as to determine ageing and predicting when it may fail. Such diagnosis may also be of interest for assessing the environment of the bushing.

Figure 1:
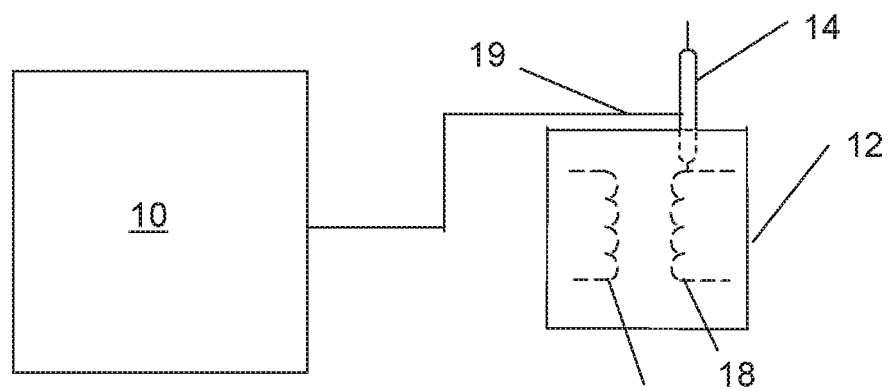

FIG. 1 schematically shows a detector 10 connected to a bushing 14. The detector and bushing together form a bushing arrangement. The detector 10 is connected to the bushing via an optical fibre 19. The bushing 14 is also attached to a piece of electrical high-voltage equipment. In the example depicted in FIG. 1, the piece of equipment is a transformer 12 provided in a transformer tank filled with an insulating fluid, in the form of transformer oil. This transformer 12 has a first and a second winding 16 and 18. The bushing 14 is attached to the transformer 12 and as an example to the second winding 18 of the transformer 12. It should here be realized that it may as an alternative be connected to the first winding instead.

The bushing 14 is a condenser core bushing. Therefore, the bushing in FIG. 1 comprises a condenser core that surrounds a central conductor. The condenser core is more particularly a solid condenser core. This also means that it has a surface that faces away from the central conductor 20.

Figure 2:
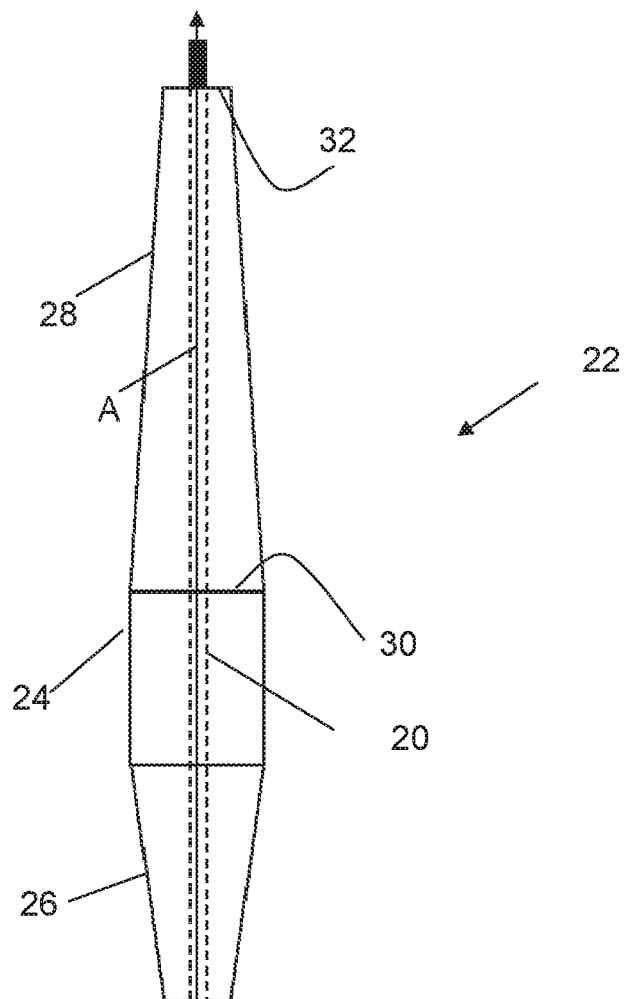

FIG. 2 schematically shows one type of such condenser core 22 surrounding a conductor 20. The condenser core comprises a central section 24 as well as a first and a second peripheral section 26 and 28, where the first and second peripheral sections 26 and 28 are placed on opposite sides of the central section 24. The conductor 20 defines a longitudinal axis A through the bushing 14 and the different sections are placed around the conductor 20 along this longitudinal axis A. Thereby the first and second peripheral sections 26 and 28 are placed on opposite sides of the central section 24 along the longitudinal axis A. The second peripheral section 28 also has a first end 30 connecting to or being joined to the central section 24 and a second end 32 defining an end of the bushing. This second end 32 also provides an output of the bushing 14, which is an end via which the conductor 20 leaves or exits the bushing 14.

The first peripheral and central sections 24 and 26 of the condenser core 22 are typically provided or adapted for being inserted into a piece of high-voltage equipment, such as reactive power equipment like a transformer. In the case of a transformer, it may be inserted in the transformer tank in order to be surrounded by insulating fluid of the tank, such as transformer oil, while the second peripheral section 28 is adapted to project out from the piece of equipment for being surrounded by air.

It can be seen that in the example given in the figures, the central section 24 has an even cross-section along the longitudinal axis A. The cross-sectional area is therefore even or the same along the longitudinal axis A. The area may be circular and in this case the radius is the same along the longitudinal axis. It can also be seen that the first and second peripheral sections 26 and 28 have cross-sections that diminish along the longitudinal axis in a direction away from the central section 24. They thus have tapering cross-sections along the longitudinal axis away from the central section. These two sections 26 and 28 thus have cross-sectional areas that grow smaller away from the central section 24 along the longitudinal axis. They thus have diminishing radii. This is done in order to adapt the size of these sections to varying lengths of foils described below. The cross-sections discussed above are all taken at right angles to the longitudinal axis A. It should here be realized that it is possible with other shapes of the sections. The first and/or the second peripheral section may for instance be cylindrical. Such a cylindrical peripheral section may then also have a cross-section that is the same as or different from the cross-section of the central section. It is also possible that the cross-section of the central section varies. Parts of it may for instance have lower diameters than the rest, for instance for the purpose of mounting to the flange.

The condenser core 22 typically comprises insulation made of paper and between these papers there is provided foils of electrically conducting material, such as metal, for voltage control purposes. These foils and insulation encircle the conductor 20. The paper may be cellulose or synthetic, such as thermoplastic. The condenser core may further be solidified using a resin, such as an epoxy resin.

Figure 3:
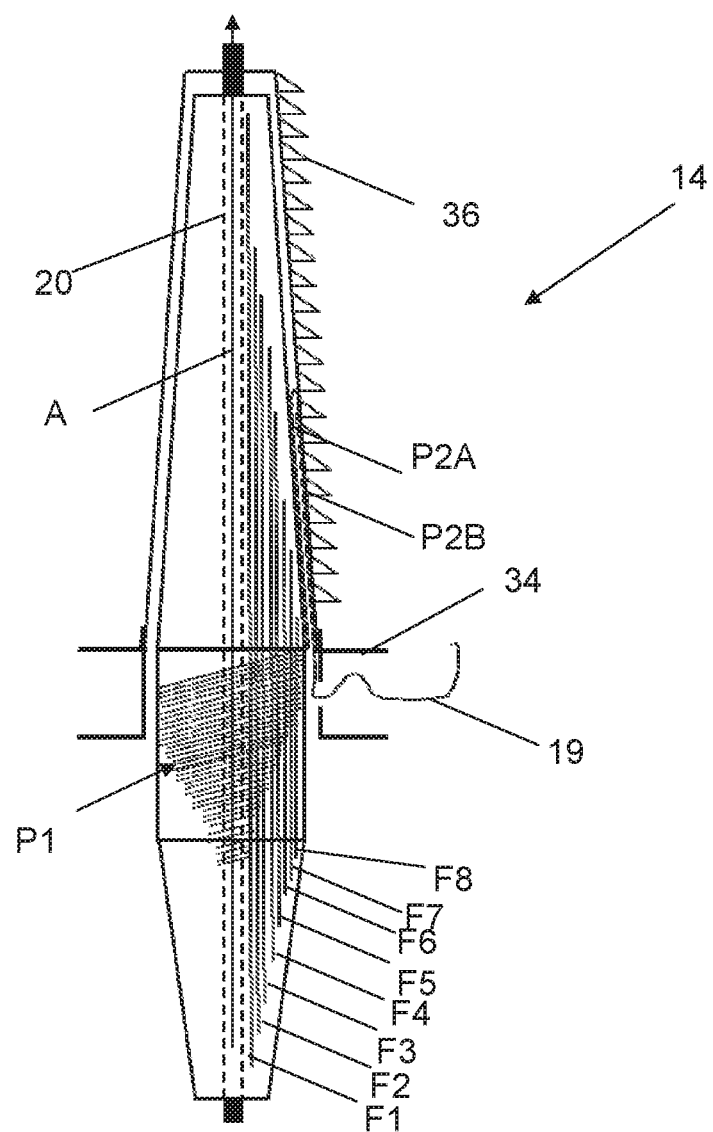

FIG. 3 shows some more details of the bushing 14, with an optical fibre being placed in a first way in the bushing 14. As can be seen the main conductor 20 is radially surrounded by a number of foils F1, F2, F3, F4, F5, F6, F7 and F8 of electrically conducting material, which are the above-mentioned foils in the interior of the condenser core. In this bushing 14 there is thus a first innermost foil F1, which surrounds the main conductor 20. A second foil F2 in turn surrounds the first foil F1. Thereafter follows a third foil F3 that surrounds the second foil F2. A fourth foil F4 surrounds the third foil F3. A fifth foil F5 surrounds the fourth foil F4, a sixth foil F6 surrounds the fifth foil F5, a seventh foil F7 surrounds the sixth foil F6 and finally an eighth outermost foil F8 surrounds the seventh foil F7. It should also be realized that the number of foils shown is merely an example.

The foils are more particularly being wound around and coaxial with the central conductor 20. The foils are also spaced from each other in a direction that is perpendicular to the longitudinal axis A of the conductor 20. This direction that is perpendicular to the longitudinal axis A is in this embodiment a radial direction. Each foil, which as an example may be an aluminum or copper foil, is as an example formed as a hollow cylinder, with each foil having an increased diameter in relation to the previous foil closer to the main conductor 20 in the radial direction. A foil that is closer than a neighboring foil to the main conductor 20 in the radial direction furthermore has a longer extension along the longitudinal axis A than this neighboring foil. The diameter and length may be selected so that each foil should cover the same area. Therefore, the lengths of the foils along the longitudinal axis A decrease with the distance, here radial, to this axis A. It can thus be seen that the foil length of any outer foil is lower than any inner foil that it surrounds or put differently, the foil length in the longitudinal direction of any foil on a radial distance from the conductor is shorter than the foil length of any neighboring foil on a lower radial distance from the conductor.

The central section 24 is also connected to a flange 34 for grounding purposes. It can also be seen that the second peripheral section 28 is surrounded by a solid isolator 36, which may be ceramic. There may here be a gap between the second peripheral section 28 of the condenser core 22 and the solid isolator 36 and this gap may be filled with fluid insulation.

As can be seen in FIG. 3 the optical fibre 19 is also provided in the bushing 14. The optical fibre comprises a first part P1 that is placed in the condenser core 22 and that stretches through the central section 24 of the condenser core 22. The first part is thus placed in the interior of the solid condenser core. In the variation of the bushing shown in FIG. 3, the fibre also comprises a second part provided adjacent the surface of the second peripheral section 28. The second part comprises at least one first straight segment stretching along and in parallel with the condenser core surface between the first and second ends 30, 32 of the second peripheral section 28. In the variation of FIG. 3 the second part comprises a first and a second such segment P2A, P2B. It can be seen that the first segment P2A starts at the first end 30 of the second peripheral section 28, stretches a length along the condenser core surface of the second peripheral section 28 and is joined with the second straight segment P2B that returns back to the first end 30 of the second peripheral section 28 along the condenser core surface. It can also be seen that both segments are placed in the gap between the solid condenser core and the solid isolator 36. They may thereby also be surrounded by the fluid insulation in this gap.

As can also be seen in FIG. 3, the first part P1 of the fibre comprises a number of turns of fibre wound around the central conductor 20 between different foils F1, F2, F3, F4, F5, F6, F7 and F8 of the central section 24, The first part P1, which in this case may actually start in the first peripheral section 26, is more particularly shaped as a funnel where the radial distance of the turns increase from adjacent a first end of the first part P1 in a first area of the condenser core 22 where the central section 24 joins the first peripheral section 26 towards a second end of the first part P1 in a second area of the condenser core 22 where the central section 24 joins the second peripheral section 28, which is at the first end 30 of the second peripheral section 28. Thereby the fibre is wound between different foils in the central section and optionally also in a part of the first peripheral section 26 in such a way that the turns stretch from being placed between an innermost foil F1 of the condenser core 22 and the conductor 20 to being placed between an outermost foil F8 and the condenser core surface, i.e. to being placed inside the solid condenser core 22 between the outermost foil and the outer surface of the condenser core 22. Moreover, each turn encircles an area that is angled in relation to the longitudinal axis A of the conductor 20 so that one point of a turn is closest to the second peripheral section and an opposite point of the same turn is closest to the first peripheral section. The normal of such an area defined or encircled by a turn may thus be offset from the longitudinal axis A by an angle. All the turns may furthermore be angled with the same angle to the longitudinal axis A.

The optical fibre also exits the condenser core at the flange 34. The first segment P2A of the second part of the fibre is here joined to the end of the first part P1 of the fibre that has the highest turn radius, which is where the central section 24 joins the second peripheral section 28. The second segment P2B is in turn joined to the part of the fibre that exits the bushing at the flange 34.

The optical fibre is adapted to detect physical properties of the bushing condenser core that are influenced or caused by its operation. These detected physical properties are indicative of the health of the bushing. The properties may furthermore be the properties of the condensers core, in which case they may also be indicative of condenser core health.

It can be seen that an optical fibre is introduced inside and on the outer surface of the condenser core 22 in an electric field to measure physical properties of the condenser core influenced or caused by the use of the bushing. These physical properties are measured directly in the solid material of the condenser core, which material may be epoxy or thermoplastics. Physical properties caused and/or changed by the influences, such as temperature and electrical field strength, will thus be obtained directly from inside he the insulation material of the condenser core and optionally also from the condenser core surface.

It is in this way possible to measure online the status and health of the capacitive condenser core and thereby also of the bushing. It is for instance possible to detect hot spots of the solid condenser core, i.e. areas where the temperature is significantly higher than in other parts of the condenser core. It is more particularly possible to measure the deviation of real time temperature in C.° at a hot spot inside the solid insulation material as the bushing is being used. It is also possible to detect real time electrical stress kV/mm inside the solid insulation material at the most stressed area of the condenser core, which is typically between edges of neighboring foils. In this regard the first part of the fibre may contribute more to the hot spot measurements, while the second part may contribute more to the electrical stress measurements. The fact that the fibre is wound inside the condenser core in between the foil inserts may simplify detecting the temperature deviation of the hot spots and possibly also voltage stress. Thereby it is possible to obtain earlier warnings than if a deviation in capacitance and tan d measurements are being made since such deviations have already occurred after breakdown. It is also possible to measure transient stresses inside the condenser core and if the equipment is a part of an electrical grid, to give information to the grid operator, about the health of the bushing.

It is also possible to conduct diagnostic on a bushing prepared with the sensors in real time in service.

The bushing arrangement therefore detects physical properties of the condenser core being caused or influenced by the operation of the bushing, which properties comprise condenser core temperature and/or electrical field strength, which electrical field strength measurements may be used to determine the electrical field stress between foil edges.

The detector may comprise an opto/electrical transducer for converting an optical signal into the electrical domain and vice versa. It may also comprise circuitry for generating light pulses and for evaluating returned light.t may also comprise sampling circuitry. The evaluating circuitry may be implemented using software running on a processor.

Through the bushing realization, the detector is capable of detecting high electrical fields. It can also detect overvoltages coming from transients, very fast transient or harmonics, such as in High Voltage Direct Current (HVDC) applications. Thereby, it is possible to measure high electrical fields and to collect the information and in the long term identify ageing or overstress of the insulation material.

Depending on the frequency and/or speed of the sampling circuitry it is possible to provide a lower sampling possibility to only give warnings, not tripping, or to provide more advanced sampling equipment used to detect overvoltages or to perform failure investigations on bushings. This is possible if a bushing is prepared with optic sensors that can replace a failed bushing in a transformer. If such a prepared bushing is connected to the more advanced sampling equipment, it may then be possible to perform investigations in service mode with full voltage on.

When the temperature and the electrical stresses that the insulation material is exposed to are monitored, it is possible to improve on the determination of the lifetime of the bushing, which is of advantage in maintenance situations and for diagnosing defects in the environment in which the bushing is provided.

An unhealthy bushing may thus indicate a defect or a problem in the environment in which the bushing is placed. It may as an example be indicative of a leakage in the previously disclosed tank. It may also or alternatively be indicative of imbalances in an electrical grid to which the piece of high voltage equipment is connected.

In the variation shown in FIG. 3 the temperature and voltage stress experienced by the foil edges are measured on the oil side of the bushing, which oil side is typically made up of the central and first peripheral sections 24 and 26 of the condenser core.

Figure 4:
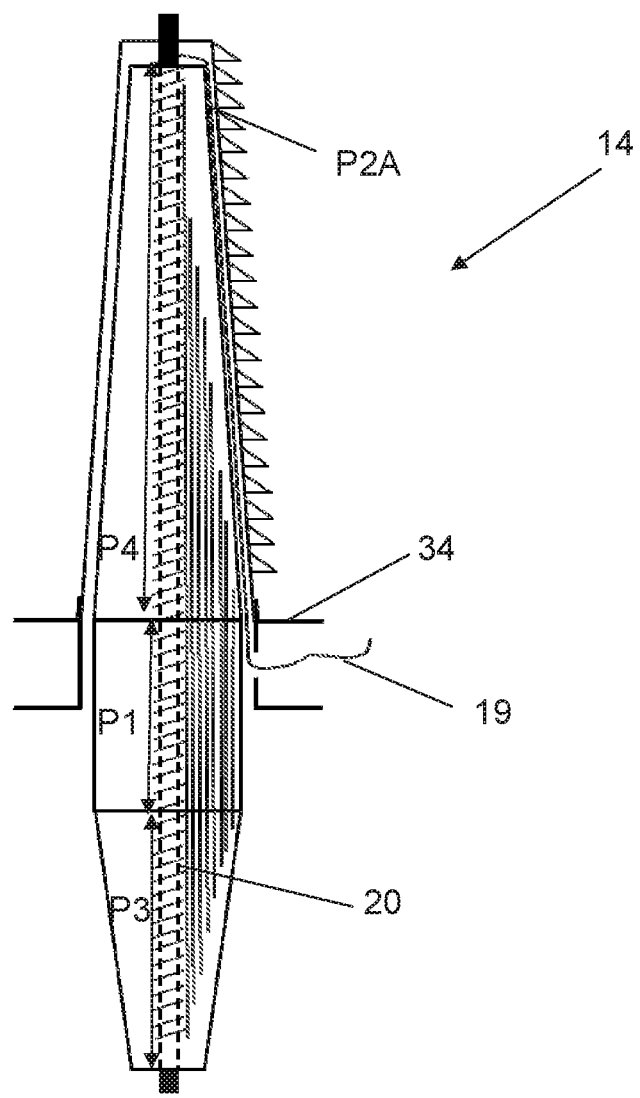

FIG. 4 shows a realization with the optical fibre being placed in a second way in the bushing. This realization is suitable for measuring the temperature of the bushing along the conductor together with detecting the electrical field stress on the air side of the bushing 14, which air side is typically made up of the second peripheral section 20.

As can be seen in FIG. 4, the first part P1 of the fibre is only placed in the central section 24. It more particularly comprises turns having the same radius and being placed between the innermost foil F1 and the conductor 20. There is also a third part P3 of the fibre in the first peripheral section 26 with turns having the same radius and being placed between the innermost foil F1 and the conductor 20 as well as a fourth part P4 in the second peripheral section 28 with turns having the same radius and being placed between the innermost foil F1 and the conductor 20. The radius of the turns of the first, third and fourth parts P1, P3, P4 of the fibre is here the same for all parts. These turns are also all angled to the longitudinal axis A, which may be an angling in the same way and using the same angle as in FIG. 3.

The third part P3 is in this case connected to or joined with the first part P1, which in turn is connected to or joined with the fourth part P4, which exits the condenser core 22, but not the bushing 14, at the second end 32. A first straight segment P2A of the second part is connected to the end of the fourth part P4 exiting the condenser core 22.

The first straight segment P2A then stretches all the way between the first and second ends 30, 32 of the second peripheral section 28. The first segment P2A thus starts at the second end 32 of the second peripheral section 28 and then ends at the first end 30, where it is connected to the part of the fibre that again exits the bushing via the flange 34 at the central section 24.

Figure 5:
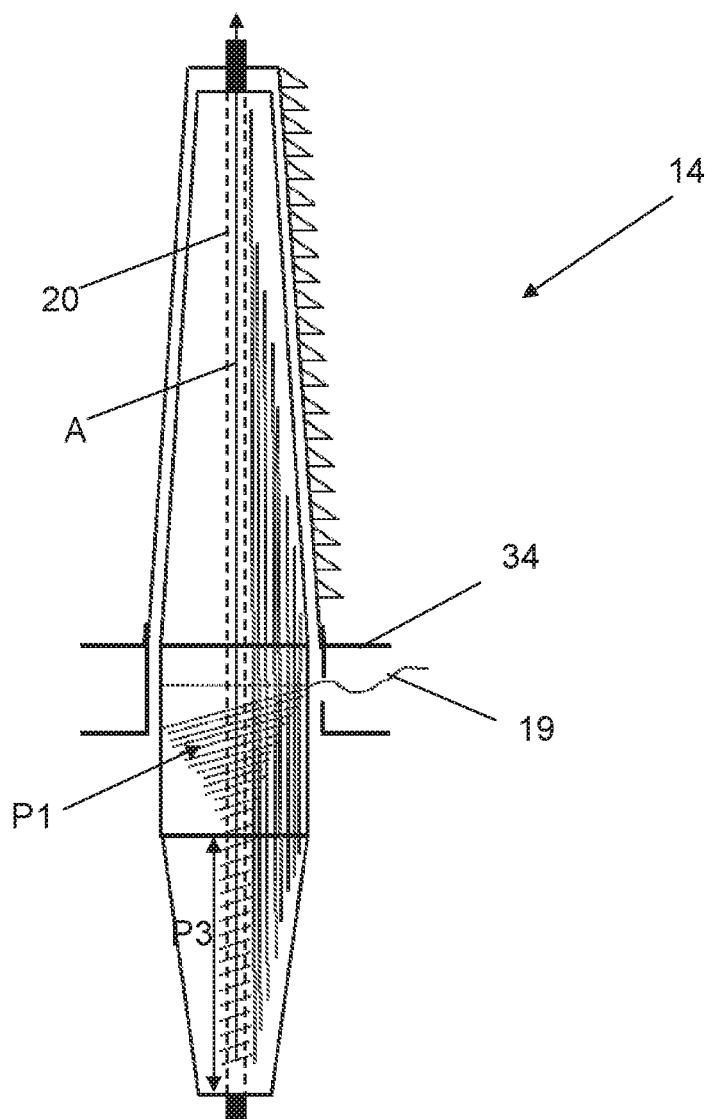

Another realization with the optical fibre placed in a third way is the bushing shown in FIG. 5. This realization is suitable for measuring the condenser core temperature on the oil side of the bushing.

In this case the fibre comprises the first part P1 having the same type of realization as in FIG. 4. However, it can be seen that the fibre does not reach all the way up to the first end 30 of the second peripheral section 28. Instead the first part P1 is connected to the fibre part that exits the bushing at the flange 34. The first part thus ends before the second peripheral section 28 is reached. It can be seen that there is also here the previously described third part P3 with an even turns radius in the first peripheral section 26 and being connected to the first part. There is also no second part. All turns may also here be angled to the longitudinal axis A in the same way and using the same angle as in FIG. 3.

It should be realized that it is possible to also add a second part of the fibre to the bushing in FIG. 5, in the same way as is shown in FIG. 3. It is also instead or additionally possible to add a fourth part to the bushing in FIG. 5, in which case the fourth and second parts may be realized in the way shown in FIG. 4, i.e. with the fourth part connected to the first part at the area where the central section joins the second peripheral section and the second part stretches along the condenser core surface between the second end of the second peripheral section and the flange at the central section. Alternatively, it is possible to have also the fourth part of the second peripheral section shaped as a funnel and being wound around the central conductor between different foils. This latter variation is also possible to make in the realization shown in FIG. 4

It is a bit tricky to produce the bushing due to the fact that the fibre and the condenser core material react differently to the application of heat in the production process. They shrink differently. The fibre is also sensitive to cuts and excessive bending. This may pose problems in the connection of the fibre to the detector. This is also addressed by the invention.

The connectivity problem is addressed through providing an enclosure for the part of the fibre that is to be connected to the detector. Such an enclosure may be provided in the condenser core at the flange. The enclosure may surround a length of the fibre that is to be drawn out of the condenser core for connection to the detector via the flange. The enclosure may comprise an interior volume having an inner surface, which inner surface has at least one point at a maximum radial distance from the longitudinal axis. The volume may also comprise a distancing element keeping the length of fibre at a pre-determined distance from the above-mentioned point on the inner surface.

The enclosure may comprise a first and second chamber, where the first chamber comprises the length of fibre that is to be used for interconnection with the detector and the second chamber is an auxiliary chamber that is essentially empty. The second chamber is also radially further away from the longitudinal axis than the first chamber. Put differently, the whole of the first chamber is closer to the longitudinal axis than the second chamber. In this case the distancing element may be a wall separating the first chamber from the second chamber and the inner surface may be an inner surface of the second chamber.

Figure 6:
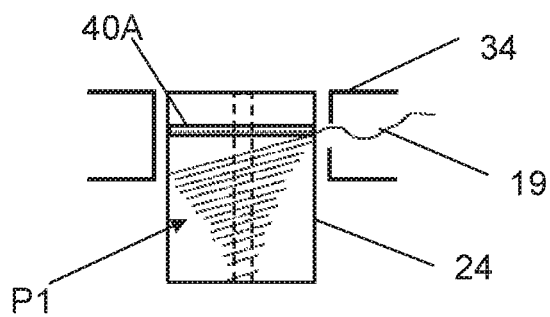

FIG. 6 schematically shows the central section 24 of the condenser core from FIG. 5, but where the length of the fibre provided for interconnection is enclosed by a first type of enclosure in the form of a hose 40A in the condenser core, such as a Silicone hose, that protects the fibre. The hose 40A is embedded in the condenser core just underneath its surface and stretches around the longitudinal axis, for instance radially.

Figure 7:
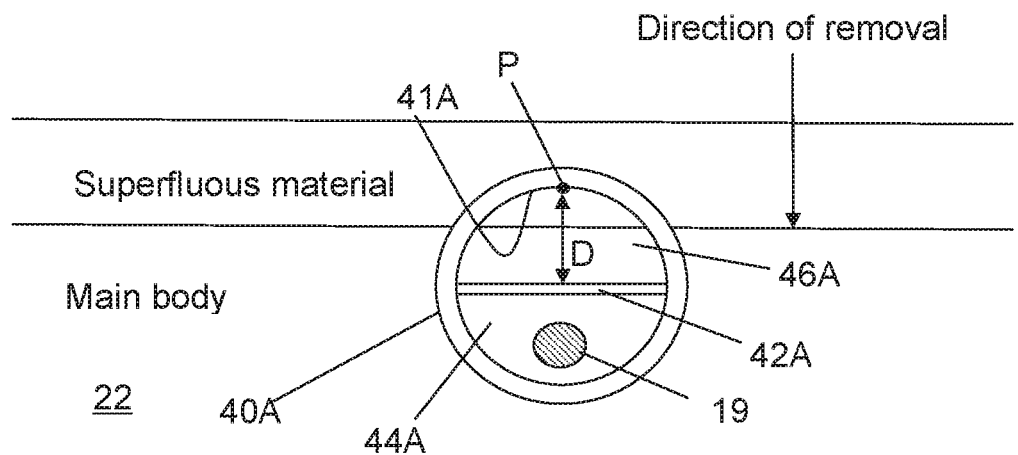

FIG. 7 schematically shows how the hose 40A is placed inside the condenser core and its two chambers; a first chamber 44A comprising the fibre 19 and a second auxiliary chamber 1A that is empty, where the first chamber 44A is separated from the second chamber 46A by a central wall 42A, which thus forms the distancing element. It can also be seen that the inner surface having a point P at a maximum radial distance to the longitudinal axis, is an inner surface 41A of the second chamber 46A. In the figure also the pre-determined distance D of the distancing element 42A to this point P is shown.

As can be seen, the hose 40A is initially totally buried inside the condenser core adjacent the surface. In order to access the fibre 19 for connection to the detector, material is removed from the condenser core surface and perhaps only from the central section of the condenser core surface in a final material removal step. This material removal, which may be made in a radial direction towards the longitudinal axis, may involve cutting away material from the surface, for instance using knives. This material removal is carried out until the hose 40A is located. Material removal is thus ended as soon as the hose 40A has been discovered. It is then likely that during the removal of material a part of the outer hose wall will be removed, which is then a part of the hose where also the point P of the inner surface 41A that is at the maximum radial distance to the longitudinal axis is provided. However, as the length of fibre is distanced the pre-determined distance D from the above-mentioned point P, the part of the outer wall of the hose that is being removed will be the outer wall of the second chamber 46A that is empty. No harm will be made to the fibre 19, as it is placed in the first chamber 44A. For this reason the pre-determined distance D may also correspond to a maximum allowed material removal depth.

It is then possible to draw out the length of fibre 19 from the first chamber 44A and connect it to the detector via the flange.

Figure 8:
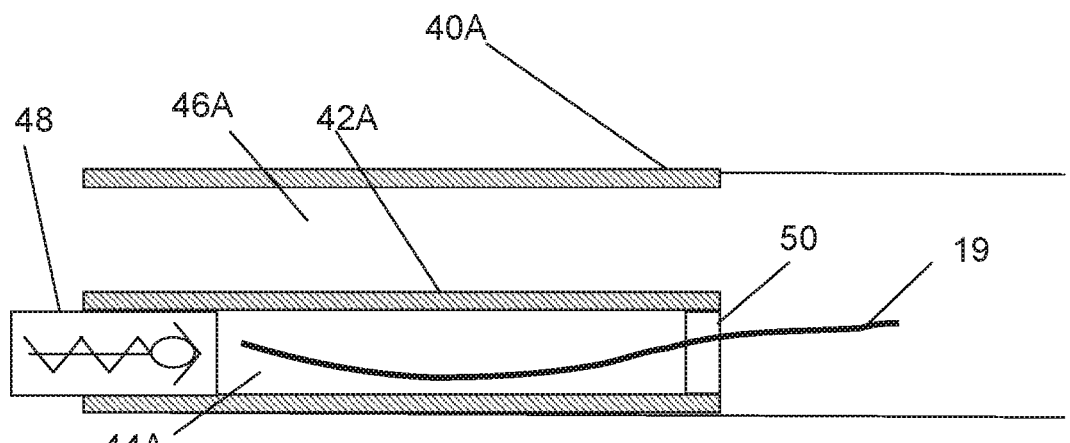

As can be seen in FIG. 8, the first chamber 44A can in one end be sealed using a unidirectional valve 48 and sealed with a tight seal 50 in an opposite end, which ends forms a fluid exhaust area and a fibre entry area of the first chamber 44A. The unidirectional valve 48 is unidirectional in that it allows a unidirectional flow of fluid, such as air, from within the chamber 44A to the outside but stops fluid, such as epoxy, from flowing into it. The unidirectional valve 48 may be realized in a number of different ways where one is in the form of a Presta valve.

The hose 40A may have different types of cross-sectional areas. It may for instance be elliptic, such as circular, or it may be rectangular, such as square.

Figure 9:
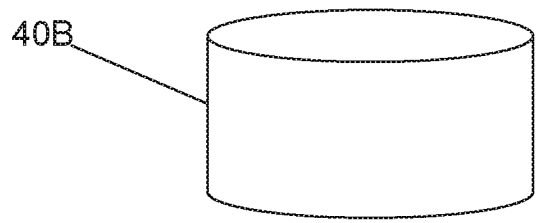
Figure 10:
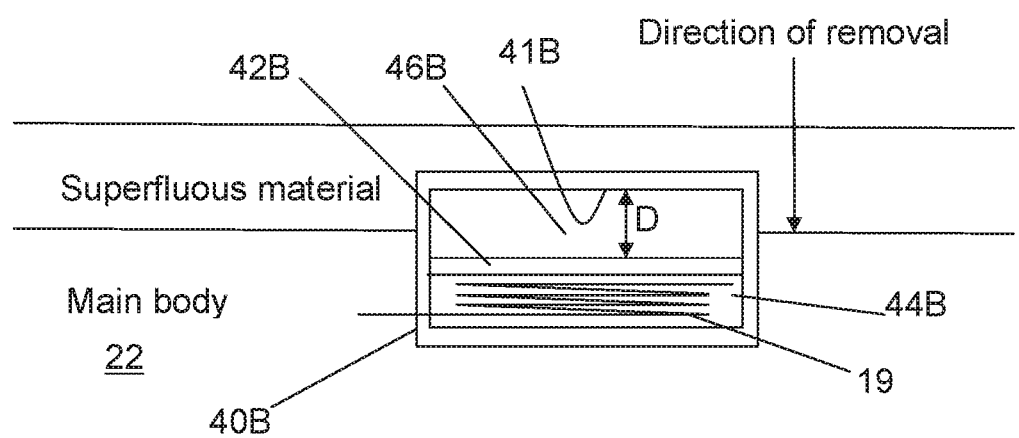

FIGS. 9 and 10 shows a second type of protective enclosure, in the form of a box 40B, which box may be cylindrical in shape. The box 40B may also be made of Silicone. This box 40B may be provided in a limited size area of the central section of the condenser core close to the outer surface of the core, such as in a sector of the central section of the condenser core, and buried just underneath the surface. The box 40B may have a first and a second chamber 44B and 46B separated by a wall 42B, where again the second chamber 46B is radially further away from the longitudinal axis than the first chamber 44B. In this case a number of turns of fibre 19 may be placed in the first chamber 44B. Also in this case, the wall 42B forms the distancing element distancing the length of fibre a pre-determined distance D from an inner surface 41B of the second chamber 46B, which inner surface has at least one point at a maximum radial distance from the longitudinal axis.

The fibre 19 in the box 40B is accessed in the same way, through removing material from the condenser core surface in a radial direction towards the longitudinal axis until the box 40B is located. Any removal of material from the outer box wall will then be from the wall of the second chamber 46B that is empty. After the box 40B has been discovered the fibre windings may be drawn out from the first chamber 44B and connected to the detector via the flange.

Naturally also the first chamber of the second type of enclosure may have a fibre entry area that has a tight seal and a gas exhaust area sealed with a unidirectional valve.

In the case of a box, it is also possible to omit the use of chambers. Instead the distancing element may be a disc or plate, placed between the inner surface of the interior volume and the length of fibre. The disc may as an example be a plastic disc. Material removal will then involve removing disc material, but not any fibre.

From the foregoing discussion it is evident that the present invention can be varied in a multitude of ways.

It shall consequently be realized that the present invention is only to be limited by the following claims.

The invention claimed is:

1. A bushing for high voltage applications comprising a conductor defining a longitudinal axis (A) through the bushing,
said bushing having a central section and a first and a second peripheral section on opposite sides of the central section along the longitudinal axis (A), and
comprising an optical fibre for detecting physical properties being influenced or caused by the operation of the bushing and having a first part (P1) stretching through the central section, wherein the sections are sections of a solid condenser core and further comprising an enclosure for a length of fibre that is to exit the bushing, said enclosure being buried in the central section adjacent the surface of the condenser core and having an interior volume with an inner surface comprising at least one point (P) at a maximum radial distance from the longitudinal axis, said enclosure comprising a distancing element keeping the length of fibre at a pre-determined distance (D) from said point,
wherein the enclosure comprises a first and a second chamber, where the second chamber is radially further away from the longitudinal axis than the first chamber, which comprises the length of fibre and is separated from the second chamber by a central wall which central wall forms the distancing element.

2. The bushing according to claim 1, wherein the fibre exits the bushing via a flange surrounding the central section.

3. The bushing according to claim 1, wherein the second peripheral section comprises a first end joined to the central section and a second end defining an end of the bushing through which the central conductor exits and said fibre comprising a second part with at least one first straight segment (P2A) stretching outside of the condenser core along the condenser core surface between the first and second ends of the second peripheral section.

4. The bushing according to claim 3, wherein the first straight segment (P2A) stretches all the way between the first and second ends of the second peripheral section.

5. The bushing according to claim 3, wherein the first straight segment starts (P2A) at the first end of the second peripheral section, stretches a length along the condenser core surface and is joined with a second straight segment (P2B) returning back to the first end of the second peripheral section.

6. The bushing according to claim 1, wherein the bushing comprises a number of foils (F1, F2, F3, F4, F5, F6, F7, F8) of conductive material, wound around and coaxial with the conductor, where the length in the longitudinal direction of any foil on a radial distance from the conductor is shorter than the foil length of any neighboring foil on a lower radial distance from the conductor.

7. The bushing according to claim 6, wherein the first part (P1) of the fibre comprises a number of turns of fibre wound around the central conductor between different foils (F1, F2, F3, F4, F5, F6, F7, F8) of the central section.

8. The bushing according to claim 7, wherein the radial distance of the turns increase from a first end of the first part in a first area where the central section joins the first peripheral section towards a second end of the first part in a second area where the central section joins the second peripheral section.

9. The bushing according to claim 8, wherein the sections are sections of a solid condenser core and the turns in the first part (P1) stretch from being placed between an innermost foil (F1) and the conductor to being placed between an outermost foil (F8) and the condenser core surface.

10. The bushing according to claim 9, wherein each turn encircles an area that is angled in relation to the longitudinal axis (A) of the conductor so that one point of a turn is closest to the second peripheral section and an opposite point of the same turn is closest to the first peripheral section.

11. The bushing according to claim 6, wherein the first part (P1) of the fibre comprises turns having the same radius and being placed between the innermost foil (F1) and the conductor.

12. The bushing according to claim 6, wherein the fibre comprises a third part (P3) in the first peripheral section joined with the first part, said third part having turns with the same radius and being placed between the innermost foil (F1) and the conductor.

13. The bushing according to claim 6, wherein the fibre comprises a fourth part (P4) in the second peripheral section joined with the first part, said fourth part having turns with the same radius and being placed between the innermost foil (F1) and the conductor.

14. A bushing arrangement comprising the bushing according to claim 1 and at least one detector configured to detect physical properties of the bushing influenced or caused by the operation of the bushing.

* * * * *